(12) United States Patent
Jung et al.

(10) Patent No.: US 11,730,026 B2
(45) Date of Patent: Aug. 15, 2023

(54) DISPLAY APPARATUS

(71) Applicant: Samsung Display Co., Ltd., Yongin-si (KR)

(72) Inventors: Hyunggi Jung, Yongin-si (KR); Kihwan Kim, Yongin-si (KR); Beomjin Kim, Yongin-si (KR); Soonchang Yeon, Yongin-si (KR); Sunghyun Lee, Yongin-si (KR); Jaemin Lee, Yongin-si (KR); Jaeyoung Lee, Yongin-si (KR)

(73) Assignee: Samsung Display Co, Ltd., Yongin-si (KR)

( * ) Notice: Subject to any disclaimer, the term of this patent is extended or adjusted under 35 U.S.C. 154(b) by 179 days.

(21) Appl. No.: 17/154,881

(22) Filed: Jan. 21, 2021

(65) Prior Publication Data

US 2022/0013614 A1    Jan. 13, 2022

(30) Foreign Application Priority Data

Jul. 7, 2020   (KR) .......................... 10-2020-0083670

(51) Int. Cl.
*H10K 59/131* (2023.01)
*H10K 59/126* (2023.01)

(52) U.S. Cl.
CPC ......... *H10K 59/131* (2023.02); *H10K 59/126* (2023.02)

(58) Field of Classification Search
CPC ............ H01L 27/3276; H01L 27/3272; H01L 27/3244; H01L 51/52; H01L 51/5203; H10K 59/131; H10K 59/126; H10K 50/80; H10K 59/12; H10K 50/805
See application file for complete search history.

(56) References Cited

U.S. PATENT DOCUMENTS

| 10,134,777 | B2 | 11/2018 | Park |
| 2010/0109993 | A1 | 5/2010 | Chang |
| 2018/0130856 | A1* | 5/2018 | Kim .................... H01L 27/3218 |
| 2018/0145127 | A1* | 5/2018 | Shin .................... H01L 51/5253 |
| 2019/0393294 | A1 | 12/2019 | Song et al. |

FOREIGN PATENT DOCUMENTS

| KR | 10-0596467 | 7/2006 |
| KR | 10-2008-0034546 | 4/2008 |
| KR | 10-1490485 | 2/2015 |
| KR | 10-2019-0038718 | 4/2019 |
| KR | 10-2073636 | 2/2020 |

* cited by examiner

*Primary Examiner* — Adam R. Giesy

(74) *Attorney, Agent, or Firm* — H.C. Park & Associates, PLC

(57) ABSTRACT

A display apparatus includes a substrate having a display area and a peripheral area outside the display area, a pad located in the peripheral area, a first line located in the peripheral area and having one end electrically connected to the pad and the other end facing the display area, a second line having one end facing the other end of the first line and extending into the display area, the one end of the second line being spaced apart from the first line, a first connector line electrically connecting the other end of the first line to the one end of the second line, and a first power line intersecting the first line, the first power line being disposed on a first layer different from a second layer on which the first line is disposed.

24 Claims, 15 Drawing Sheets

DISPLAY APPARATUS

CROSS-REFERENCE TO RELATED APPLICATION

This application claims priority from and the benefit of Korean Patent Application No. 10-2020-0083670, filed on Jul. 7, 2020, which is hereby incorporated by reference for all purposes as if fully set forth herein.

BACKGROUND

Field

Embodiments of the invention relate generally to a display apparatus, and more particularly, to a display apparatus in which the probability of defect occurring during a manufacturing process is reduced.

Discussion of the Background

When forming a thin film in the process of manufacturing a display apparatus, a sputtering method is used for making a conductive thin film, and a chemical vapor deposition (CVD) method is used for making an insulating thin film. In any case, it is necessary to physically handle a substrate on which the thin film is to be formed, e.g., to separate the substrate from a support.

The above information disclosed in this Background section is only for understanding of the background of the inventive concepts, and, therefore, it may contain information that does not constitute prior art.

SUMMARY

Applicant recognized that defects (e.g., short circuit) may occur between conductive layers on different layers inside a display apparatus when physically handling a substrate during the manufacturing process of a display apparatus.

Display apparatus constructed according to the principles and embodiments of the invention are capable of reducing defects between conductive layers on different layers when physically handling a substrate during the manufacturing process of a display apparatus, e.g., by including a bridge line electrically connecting a data extension line and a data line spaced apart from the data extension line.

Additional features of the inventive concepts will be set forth in the description which follows, and in part will be apparent from the description, or may be learned by practice of the inventive concepts.

According to an aspect of the invention, a display apparatus includes: a substrate having a display area and a peripheral area outside the display area, a pad located in the peripheral area, a first line located in the peripheral area and having one end electrically connected to the pad and the other end facing the display area, a second line having one end facing the other end of the first line and extending into the display area, wherein the one end of the second line is spaced apart from the first line, a first connector line electrically connecting the other end of the first line to the one end of the second line, and a first power line intersecting the first line, the first power line being disposed on a first layer different from a second layer on which the first line is disposed.

The first line and the second line may include the same material and have substantially the same layer structure.

The first line and the second line may be disposed on the same layer.

The first power line may be disposed above the first line.

The first connector line and the first power line may include the same material and have substantially the same layer structure.

The first connector line and the first power line may be disposed on the same layer.

The display apparatus may further include a second power line positioned above the first power line.

The pad may include a first pad disposed on the same layer as the first line, a second pad disposed above the first pad and including the same material as the first power line, and a third pad disposed above the second pad and including the same material as the second power line.

The pad may be spaced apart from the first power line and the second power line.

The pad may include a first pad integrally formed with the first line and a third pad disposed above the first pad and including the same material as the second power line.

The pad may be spaced apart from the second power line.

The first connector line and the first power line may include the same material and have substantially the same layer structure.

The first connector line and the first power line may be disposed on the same layer.

The first connector line and the second power line may include the same material and have substantially the same layer structure.

The first connector line and the first power line may be disposed on the same layer.

The display apparatus may further include a second connector line electrically connecting one end of the first line to the pad, the one end of the first line being spaced apart from the pad.

The second connector line may be disposed on the same layer as the first connector line.

The second connector line may include the same material as the first connector line and have the same layer structure as the first connector line.

The second line may be disposed on the same layer as the first power line, and the first line may be disposed above the first power line.

The display apparatus may further include a second power line disposed above the first line.

The first connector line and the second power line may include the same material and have substantially the same layer structure.

The first connector line and the second power line may be disposed on the same layer.

The pad may include a first pad integrally formed with the first line and a third pad disposed above the first pad and including the same material as the second power line.

The display apparatus may further include a second power line between the first power line and the first line. The second line may be disposed on the same layer as the first power line.

The display apparatus may further include a pixel electrode in the display area. The first connector line and the pixel electrode may include the same material and may have substantially the same layer structure.

The display apparatus may further include a pixel electrode in the display area. The first connector line and the pixel electrode may be disposed on the same layer.

The first line may include a data extension line, the second line may include a data line, and the first connector line may include a first bridge line.

The first line may include a data extension line, the second line may include a data line, the first connector line may include a first bridge line, and the second connector line may include a second bridge line.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the inventive concepts.

DETAILED DESCRIPTION

Figure 1:
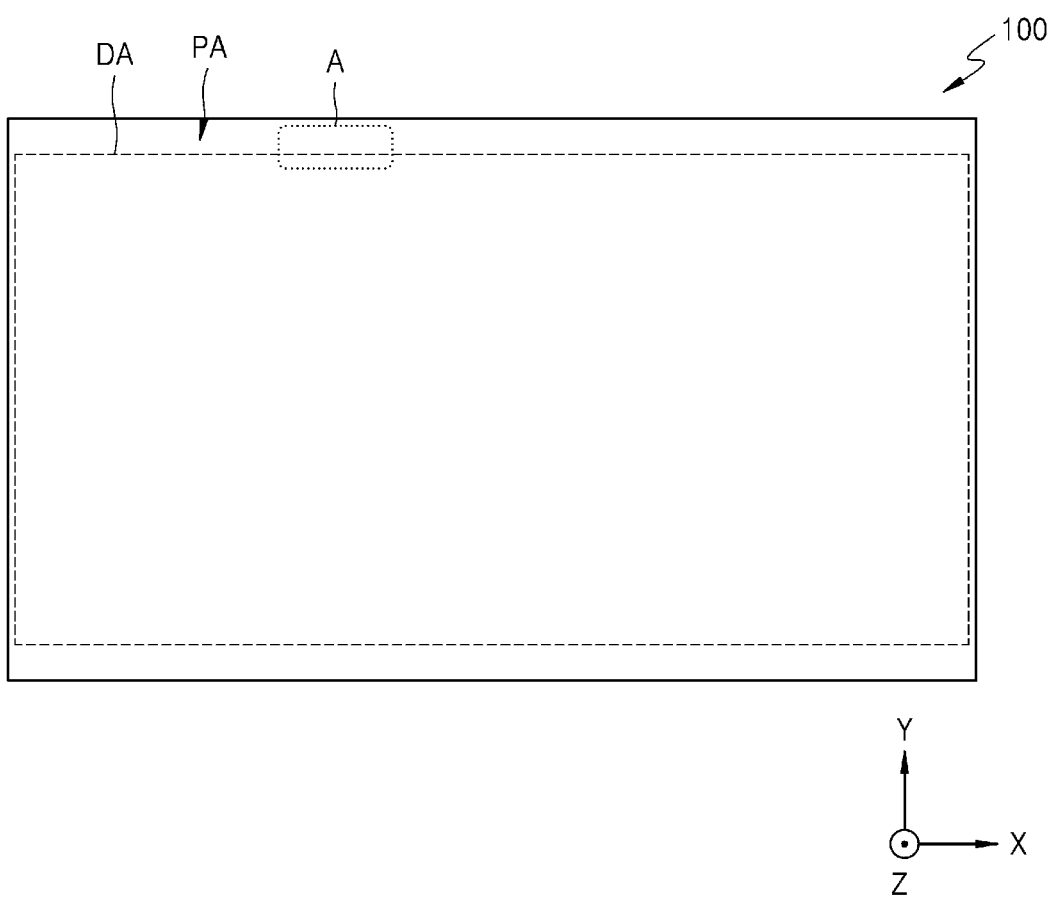
FIG. 1 is a plan view of an embodiment of a display apparatus constructed according to the principles of the invention.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element or layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a plan view of an embodiment of a display apparatus constructed according to the principles of the invention.

The display apparatus includes a substrate 100, which has a display area DA and a peripheral area PA outside the display area DA. The shape of the substrate 100 is not limited to a generally rectangular shape (in the x-y plane) as shown in FIG. 1, and may have various shapes such as circular. In addition, the substrate 100 may have a bending area and may be bent in the corresponding bending area.

The substrate 100 may include glass or metal. In addition, the substrate 100 may include a variety of flexible or bendable materials, such as polyethersulphone, polyacrylate, polyetherimide, polyethylene naphthalate, polyethylene terephthalate, polyphenylene sulfide, polyarylate, polyimide, polycarbonate, or polymer resin such as cellulose acetate propionate.

However, the substrate 100 may be modified in various ways, for example, to have a multi-layer structure including two layers including such a polymer resin and a barrier layer including an inorganic material between the two layers. In this case, the barrier layer may include silicon oxide, silicon nitride, and/or silicon oxynitride.

A plurality of display devices may be in the display area DA. For example, the display devices may be an organic light-emitting diode (OLED), and may emit red, green, blue, or white light. A driver, a power supply line, and the like may be in the peripheral area PA. In addition, the peripheral area PA may include a pad area, in which pads to which various electronic devices such as a driving integrated circuit or a printed circuit board are electrically attached are located.

Figure 2:
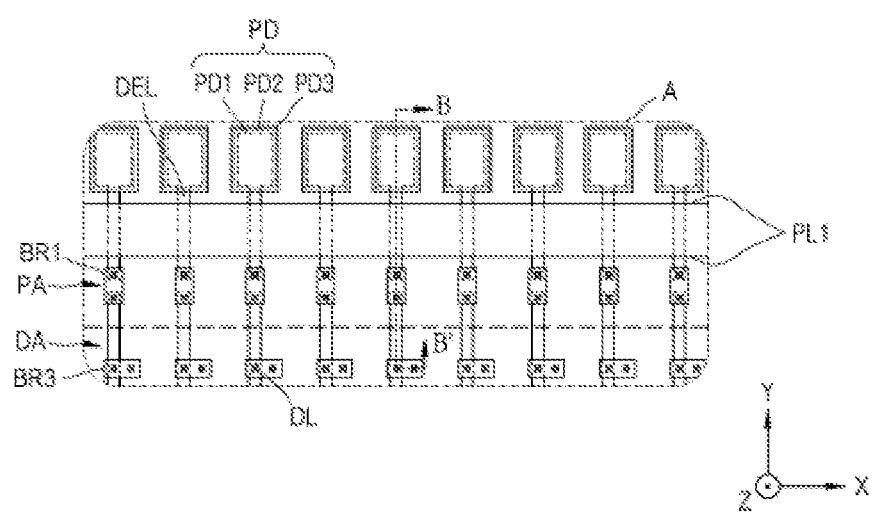
FIG. 2 is an enlarged plan view of a region A in FIG. 1.
Figure 3:
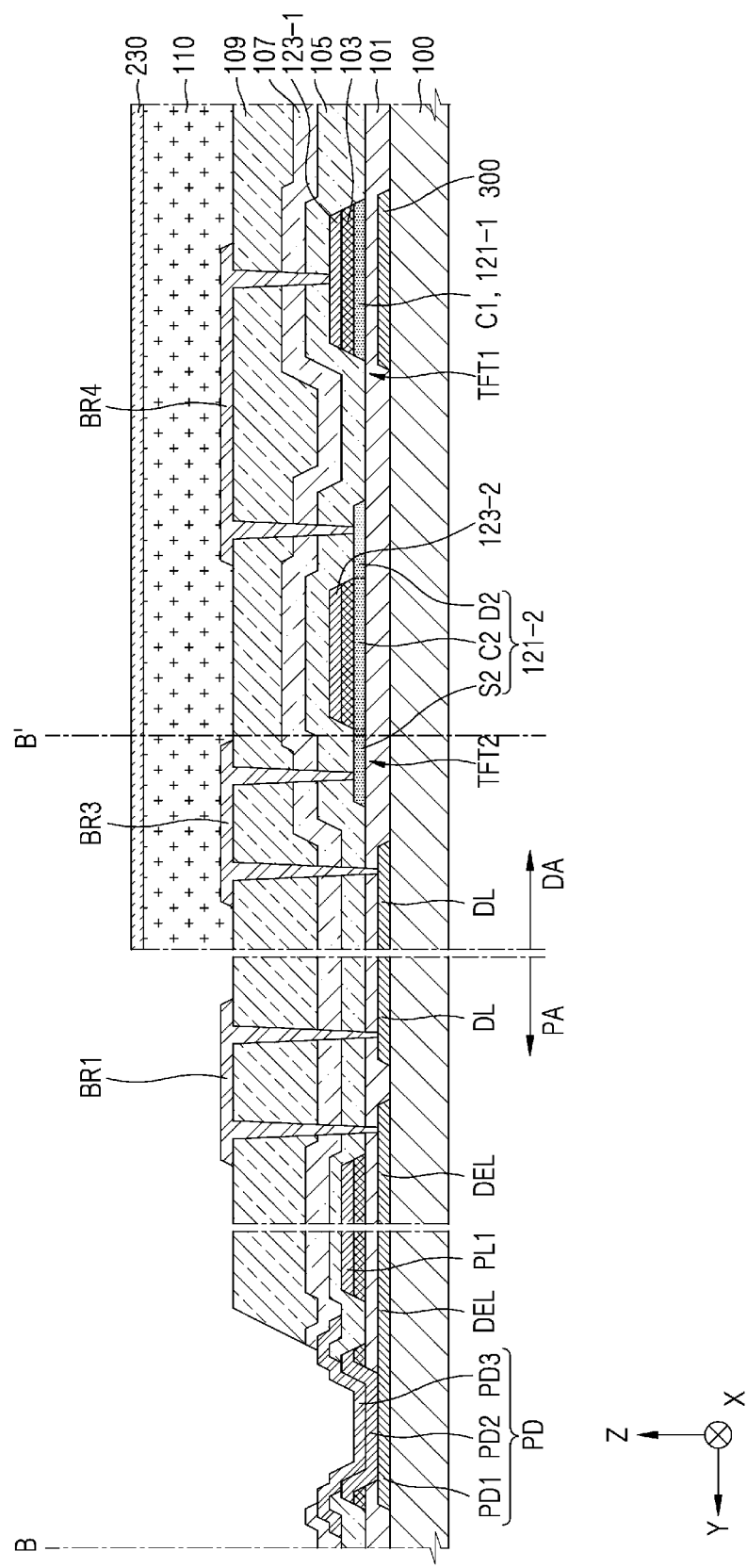
FIG. 3 is a cross-sectional view of a first embodiment of the display apparatus taken along line B-B' in FIG. 2.
Figure 4:
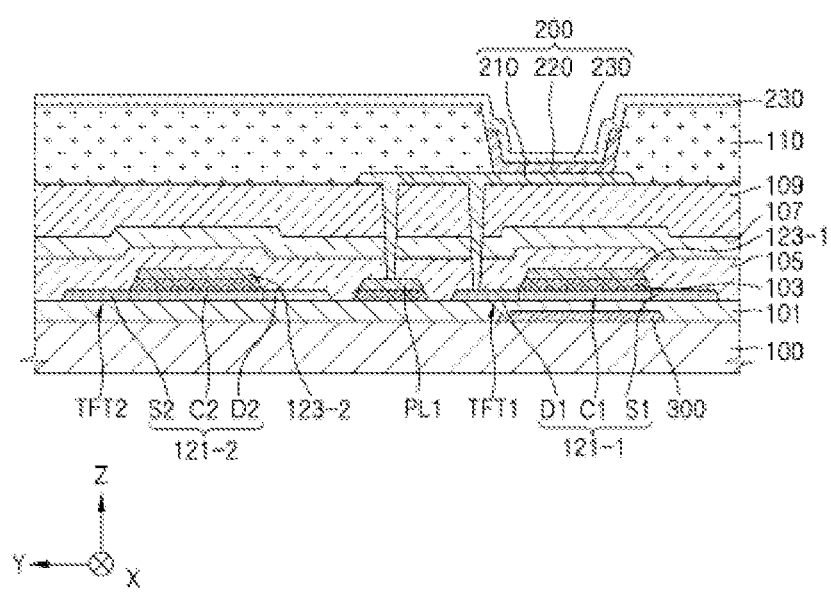
FIG. 4 is a cross-sectional view of a portion of the display area (DA) in FIG. 2.

FIG. 2 is an enlarged plan view of a region A in FIG. 1 FIG. 3 is a cross-sectional view of a first embodiment of the display apparatus taken along line B-B' in FIG. 2. FIG. 4 is a cross-sectional view of a portion of the display area in FIG. 2. The line B-B' shown in FIG. 2 extends in the y-axis direction and then, is angled in the x-axis direction. Therefore, the cross-sectional view of FIG. 3 is not a cross-sectional view taken along a straight line, but a cross-sectional view taken along line B-B', which is angled. For reference, the coordinate axis shown in FIG. 3 is a coordinate axis for showing a cross-sectional view on a portion of line B-B' extending in the y-axis direction. In addition, FIG. 3 also includes an outer portion from the line B-B' in FIG. 2, that is, an area of a first thin-film transistor TFT1.

Referring to FIGS. 2, 3 and 4, first and second thin-film transistors TFT1 and TFT2 for controlling display devices are formed on the substrate 100. These first and second thin-film transistors TFT1 and TFT2 include semiconductor layers, for example, first and second semiconductor layers 121-1 and 121-2, respectively. FIG. 4 illustrates a cross-sectional view of the first and second thin-film transistors TFT1 and TFT2.

Referring to FIG. 4, the first semiconductor layer 121-1 includes a first source area S1, a first drain area D1, and a first channel area C1 therebetween. The second semiconductor layer 121-2 includes a second source area S2, a second drain area D2, and a second channel area C2 therebetween. The first and second semiconductor layers 121-1 and 121-2 may be formed on the substrate 100. Further, as shown in FIGS. 3 and 4, a buffer layer 101 may be formed on the substrate 100, and the first and second semiconductor layers 121-1 and 121-2 may be formed on the buffer layer 101.

The buffer layer 101 may reduce or block the penetration of foreign matter, moisture, or ambient air from the lower portion of the substrate 100, and provide a substantially flat surface on the substrate 100. The buffer layer 101 may include an inorganic material such as an oxide or nitride, an organic material, or an organic-inorganic composite, and may have a single layer structure or a multi-layer structure of inorganic materials and organic materials. For example, the buffer layer 101 may have a structure in which a first buffer layer and a second buffer layer are stacked, and in this case, the first buffer layer and the second buffer layer may include different materials. For example, the first buffer layer may include silicon nitride, and the second buffer layer may include silicon oxide.

As described above, when the first buffer layer includes silicon nitride, hydrogen may be included when forming silicon nitride. Through this, the carrier mobility of the semiconductor layer formed on the buffer layer 101 may be improved, and thus, electrical characteristics of the first and second thin-film transistors TFT1 and TFT2 may be improved. In addition, the first and second semiconductor layers 121-1 and 121-2 may include a silicon material, and in this case, the interfacial bonding characteristics between the first and second semiconductor layers 121-1 and 121-2 including silicon and the second buffer layer including silicon oxide are improved, and thus, the electrical characteristics of the first and second thin-film transistors TFT1 and TFT2 may be improved.

The first and second semiconductor layers 121-1 and 121-2 may include low-temperature polycrystalline silicon (LTPS). Polycrystalline silicon materials have high electron mobility (of more than 100 cm$^2$/Vs), low energy consumption, and excellent reliability. As another example, the first and second semiconductor layers 121-1 and 121-2 may include amorphous silicon (a-Si) and/or an oxide semiconductor. Alternatively, some semiconductor layers of the plurality of thin-film transistors may include LTPS, and some of the semiconductor layers may include a-Si and/or an oxide semiconductor.

The first and second source areas S1 and S2 and the first and second drain areas D1 and D2 of the first and second semiconductor layers 121-1 and 121-2 may be doped with impurities, and the impurities may include N-type impurities or P-type impurities. The first and second source areas S1 and S2 and the first and second drain areas D1 and D2 may correspond to source electrodes and drain electrodes, respectively. The first and second source areas S1 and S2 and the first and second drain areas D1 and D2 may be interchanged depending on the property of the first and second thin-film transistors TFT1 and TFT2. In the following, the terms "first and second source areas S1 and ST" and "first and second drain areas D1 and D2" are used instead of source electrodes or drain electrodes.

A gate insulating layer 103 is positioned on the first and second semiconductor layers 121-1 and 121-2, and first and second gate electrodes 123-1 and 123-2, a first power line PL1, and a second pad PD2 may be positioned on the gate insulating layer 103. The gate insulating layer 103 may include silicon oxide ($SiO_2$), silicon nitride (SiNx), silicon oxynitride (SiON), aluminum oxide ($Al_2O_3$), titanium oxide ($TiO_2$), tantalum oxide ($Ta_2Os$), hafnium oxide ($HfO_2$), or zinc oxide ($ZnO_2$).

The first and second gate electrodes 123-1 and 123-2, the first power line PL1, and the second pad PD2, and the like may include a conductive material including molybdenum (Mo), aluminum (Al), copper (Cu), or titanium (Ti), and may have a multi-layer structure or a single-layer structure including the above materials. For example, the first and second gate electrodes 123-1 and 123-2, the first power line PL1, and the second pad PD2 may have a multi-layer structure of Mo/Al or a multi-layer structure of Mo/Al/Mo.

The first thin-film transistor TFT1 is a driving transistor and controls the amount of light emitted from an organic light-emitting diode 200 shown in FIG. 4 by controlling the amount of current supplied to the organic light-emitting diode 200. The second thin-film transistor TFT2 is a switching transistor, which receives a data signal from a data line DL shown in FIG. 3 and determines the voltage between the first gate electrode 123-1 and the first source area S1 of the first thin-film transistor TFT1. To this end, the second drain area D2 of the second thin-film transistor TFT2 may be electrically connected to the first gate electrode 123-1 of the first transistor TFT1.

In FIG. 3, a third bridge line BR3 positioned on the same layer as a pixel electrode 210 shown in FIG. 4 contacts the data line DL and the second source area S2 of the second thin-film transistor TFT2 via a contact holes formed in the buffer layer 101, a first interlayer insulating layer 105, a second interlayer insulating layer 107, and a planarization layer 109 and a contact hole formed in the first interlayer insulating layer 105, the second interlayer insulating layer 107, and the planarization layer 109. In addition, in FIG. 3, a fourth bridge line BR4 positioned on the same layer as the pixel electrode 210 is shown as contacting the second drain area D2 of the second thin-film transistor TFT2 and the first gate electrode 123-1 of the first thin-film transistor TFT1 via contact holes formed in the first interlayer insulating layer 105, the second interlayer insulating layer 107, and the planarization layer 109.

The first interlayer insulating layer 105 and the second interlayer insulating layer 107 may be sequentially stacked on the first and second gate electrodes 123-1 and 123-2, the first power line PL1, and the second pad PD2. Each of the first interlayer insulating layer 105 and the second interlayer insulating layer 107 may include silicon oxide ($SiO_2$), silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). If necessary, a line formed of a conductive material may be positioned between the first interlayer insulating layer 105 and the second interlayer insulating layer 107. For example, FIG. 3 shows that a third pad PD3 is between the first interlayer insulating layer 105 and the second interlayer insulating layer 107 in the peripheral area PA. The second interlayer insulating layer 107 may serve as a protective layer protecting the thin-film transistors TFT1 and TFT2.

The planarization layer 109 may be positioned on the second interlayer insulating layer 107, and the organic light-emitting diode 200 may be positioned on the planarization layer 109 as shown in FIG. 4.

Referring to FIG. 4, the planarization layer 109 may have a substantially flat upper surface so that the pixel electrode 210 of the organic light-emitting diode 200 may be formed substantially flat. The planarization layer 109 may include an organic material, and may have a single layer structure or a multi-layer structure. The planarization layer 109 is a general purpose polymer such as benzocyclobutene (BCB), polyimide, hexamethyldisiloxane (HMDSO), poly(methyl methacrylate) (PMMA), or polystyrene (PS), a polymer derivative having a phenolic group, an acrylic polymer, an imide-based polymer, an aryl ether-based polymer, an amide-based polymer, a fluorine-based polymer, a p-xylene-based polymers, a vinyl alcohol-based polymer, or blends thereof. The planarization layer 109 may contain inorganic materials. The planarization layer 109 may include silicon oxide ($SiO_2$), silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). When the planarization layer 109 includes an inorganic material, chemical planarization polishing may be performed in some cases. Moreover, the planarization layer 109 may include both organic and inorganic materials.

The organic light-emitting diode 200 in the display area DA may include the pixel electrode 210, a common electrode 230, and an intermediate layer 220 therebetween and including an emission layer as shown in FIG. 4.

Referring to FIG. 4, the pixel electrode 210 is connected to the first drain area D1 of the first thin-film transistor TFT1 via contact holes formed in the first interlayer insulating layer 105, the second interlayer insulating layer 107, and the planarization layer 109. The pixel electrode 210 may be a (semi) light-transmitting electrode or a reflective electrode. In some embodiments, the pixel electrode 210 may include a reflective film including silver (Ag), magnesium (Mg), aluminum (Al), platinum (Pt), palladium (Pd), gold (Au), nickel (Ni), neodymium (Nd), iridium (Ir), chromium (Cr), and compounds thereof, and a transparent or translucent electrode layer formed on the reflective film. The transparent or translucent electrode layer may include at least one selected from the group consisting of indium tin oxide (ITO), indium zinc oxide (IZO), zinc oxide (ZnO), indium oxide ($In_2O_3$), indium gallium oxide (IGO), and aluminum zinc oxide (AZO). In some embodiments, the pixel electrode 210 may have a stack structure of ITO/Ag/ITO.

A pixel defining layer 110 may be arranged on the planarization layer 109, and the pixel defining layer 110 may define a light-emitting area of a pixel by having an opening through which a central portion of the pixel electrode 210 is exposed. In addition, the pixel defining layer 110 may reduce or prevent arcing at the edge of the pixel electrode 210 by increasing the distance between edges of the pixel electrode 210 and the common electrode 230 above the pixel electrode 210. The pixel defining layer 110 is an organic insulating material such as polyimide, polyamide, acrylic resin, BCB, HMDSO, and phenol resin, and may be formed by a method such as spin coating or the like.

The intermediate layer 220 of the organic light-emitting diode 200 is positioned on the pixel electrode 210 and may include an organic emission layer. The organic emission layer may include an organic material including a fluorescent or phosphorescent material that emits red, green, blue, or white light. The organic emission layer may be a low molecular weight organic material or a high molecular weight organic material, and below and above the organic emission layer, a functional layer such as a hole transport layer (HTL), a hole injection layer (HIL), an electron transport layer (ETL), an electron injection layer (EIL), and the like may be selectively further arranged. The intermediate layer 220 may overlap each pixel electrode 210. However, embodiments are not limited thereto, and of the layers included in the intermediate layer 220, a layer such as an HTL, an HIL, an ETL, an EIL, or the like may be integrally formed over several pixel electrodes 210 in the display area DA. The intermediate layer 220 may be formed by various methods such as inkjet printing, evaporation, laser thermal transfer, or the like.

The common electrode 230 may be a light-transmitting electrode or a reflective electrode. In some embodiments, the common electrode 230 may be a transparent or translucent electrode, and may include a metal thin film having a small work function including lithium (Li), calcium (Ca), LiF/Ca, LiF/Al, Al, Ag, Mg, and compounds thereof. In addition, the common electrode 230 may further include a transparent conductive oxide (TCO) film such as ITO, IZO, ZnO, $In_2O_3$, or the like in addition to the metal thin film. The common electrode 230 may be integrally formed over several pixel electrodes 210 in the display area DA.

An encapsulation layer (not shown) including a first inorganic encapsulation layer, a second inorganic encapsulation layer, and an organic encapsulation layer therebetween may be on the common electrode 230. The first inorganic encapsulation layer and the second inorganic encapsulation layer may include silicon oxide ($SiO_2$), silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). The organic encapsulation layer may include polyethylene terephthalate, polyethylene naphthalate, polycarbonate, polyimide, polyethylene sulfonate, polyoxymethylene, polyarylate, HMDSO, acrylic resin (e.g., PMMA), polyacrylic acid, and the like), or any combination thereof.

As shown in FIGS. 3 and 4, a bottom metal layer (BML) 300 may be arranged between the substrate 100 and the thin-film first transistor TFT1. The BML 300 may be arranged in an isolated shape under the first semiconductor layer 121-1 of the first thin-film transistor TFT1. In this case, the buffer layer 101 may be positioned on the substrate 100 to cover the BML 300. The BML 300 may include Al, Pt, Pd, Ag, Mg, Au, Ni, Nd, Ir, Cr, Ca, Mo, Ti, tungsten (W), and/or Cu. The BML 300 may be a single layer or a multi-layer including the aforementioned materials. The BML 300 may shield the first thin-film transistor TFT1 from external electromagnetic waves or the like. In this case, the pixel electrode 210 may contact the BML 300 via a contact hole.

Referring to FIGS. 2 and 3, a pad PD is located in a pad area of the peripheral area PA. The pad PD may include a plurality of layers as needed. In FIG. 3, it is shown that the pad PD includes a first pad PD1, the second pad PD2 above the first pad PD1, and the third pad PD3 above the second pad PD2. As shown in FIG. 3, the first pad PD1 may be integral with a data extension line DEL. In this case, the first pad PD1 may be defined as a portion thereof overlapping the second pad PD2 and/or the third pad PD3 when viewed from a direction perpendicular to the substrate 100. Of course, at the edges of the pad PD, the buffer layer 101 and/or the gate insulating layer 103 may be between the first pad PD1 and the second pad PD2, and the first interlayer insulating layer 105 may be between the second pad PD2 and the third pad PD3.

A data signal transmitted from the pad PD is transferred to the second thin-film transistor TFT2 through the data line DL shown in FIG. 3. The data extension line DEL is arranged between the pad PD and the data line DL, as shown in FIGS. 2 and 3. One end of the data extension line DEL (e.g., +y direction) is electrically connected to the pad PD, and the other end of the data extension line DEL (e.g., −y direction) faces (i.e., extends toward) the display area DA, wherein the data extension line DEL is located in the peripheral area PA. In addition, one end of the data line DL is spaced apart from the data extension line DEL, but faces the other end of the data extension line DEL. As shown in FIG. 3, the data line DL extends into the display area DA and is electrically connected to the thin-film second transistor TFT2.

The pad PD may include the first pad PD1 to the third pad PD3 as described above. In this case, the first pad PD1, the data extension line DEL, and the data line DL may be located on the same layer as the BML 300. That is, the first pad PD1, the data extension line DEL, the data line DL, and the BML 300 may include the same material and have substantially the same layer structure.

The first pad PD1 and the data extension line DEL may be integrated as shown in FIG. 3. Referring to FIG. 3, the data extension line DEL and the data line DL may be electrically connected by using a first bridge line BR1. That is, the first bridge line BR1 may electrically connect the other end of the data extension line DEL and one end of the data line DL to each other. The first bridge line BR1 is located on the planarization layer 109 like the pixel electrode 210, and may contact the other end of the data extension line DEL and one end of the data line DL through contact holes formed in the buffer layer 101, the first interlayer insulating layer 105, the second interlayer insulating layer 107, and the planarization layer 109. In this case, the first bridge line BR1 may contain the same material and have substantially the same layer structure as the pixel electrode 210 shown in FIG. 4.

Referring to FIGS. 2 and 3, the first power line PL1 may also be located in the peripheral area PA. The first power line PL1 may be located on a layer different from a layer on which the data extension line DEL is located. For example, the first power line PL1 may be located above the data extension line DEL, and may extend in a direction (e.g., x-axis direction) intersecting with a direction in which the data extension line DEL extends (e.g., y-axis direction). However, an auxiliary power line (not shown) may be electrically connected to the first power line PL1 and extend into the display area DA. Hereinafter, for convenience, the auxiliary power line extending into the display area DA will also be referred to as the first power line PL1 (see FIG. 4). In FIG. 3, the first power line PL1 is shown to be located on the same layer as the first gate electrode 123-1 and a second gate electrode 123-2. That is, the first power line PL1 may contain the same material and have substantially the same layer structure as the first gate electrode 123-1 and the second gate electrode 123-2.

Figure 5:
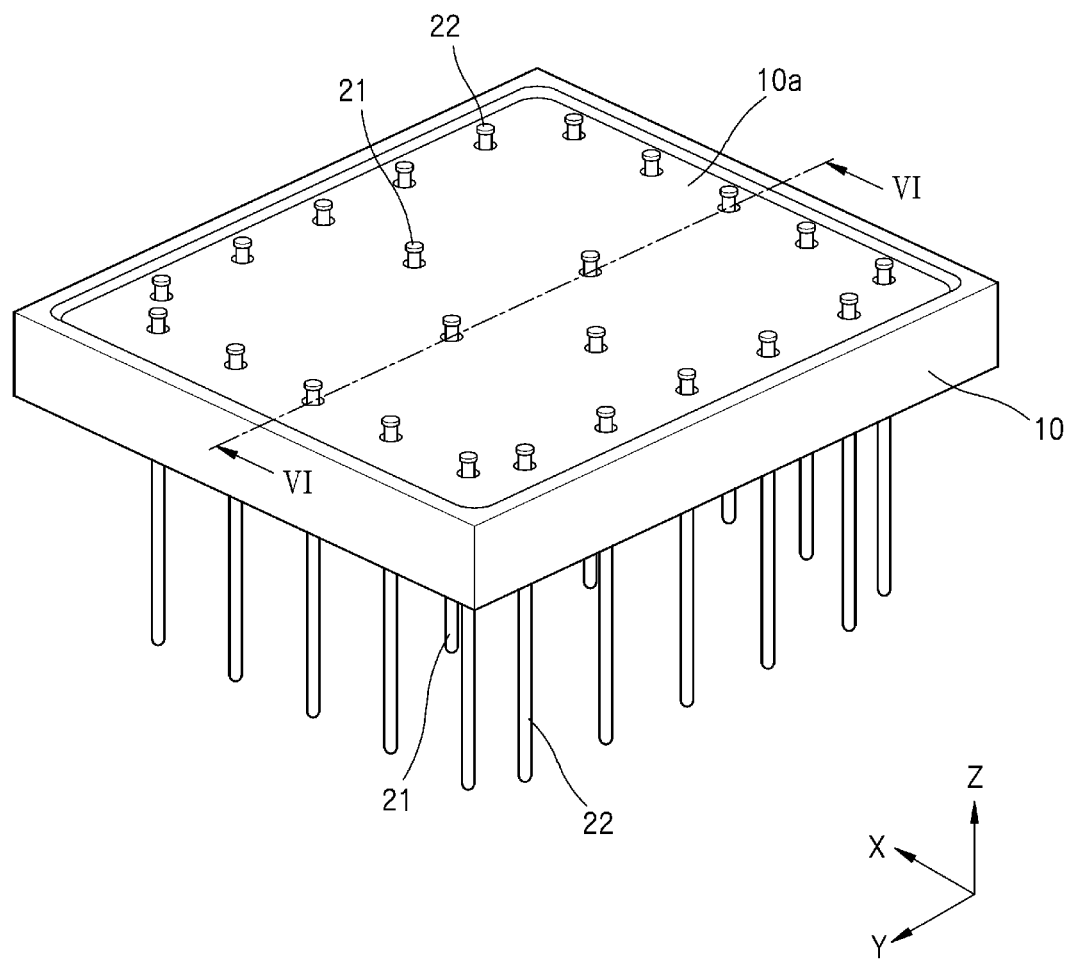
FIG. 5 is a perspective view schematically illustrating a support used in the process of manufacturing the display apparatus of FIG. 1.
Figure 6:
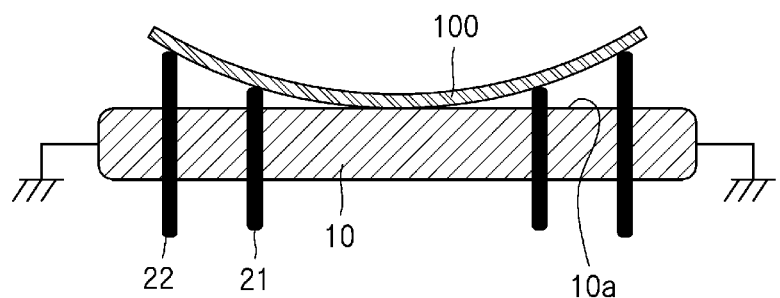
FIG. 6 is a diagram schematically illustrating a process of separating a substrate from the support of FIG. 5 in the process of manufacturing the display apparatus.

FIG. 5 is a perspective view schematically illustrating a support used in the process of manufacturing the display apparatus of FIG. 1. FIG. 6 is a diagram schematically illustrating a process of separating the substrate 100 from the support of FIG. 5 in the process of manufacturing the display apparatus.

Referring to FIGS. 5 and 6, the support used in the process of manufacturing the display apparatus of FIG. 1 includes a susceptor 10 and pins 21 and 22. The susceptor 10 may include an electrically conductive material. The pins 21 and 22 have a shape that extends vertically (e.g., along the z-axis). The susceptor 10 has a through-opening through which these pins 21 and 22 pass. The susceptor 10 has a substrate mounting surface 10a to support the substrate 100 shown in FIG. 6 to be processed. The susceptor 10 includes an electrically conductive material and has electrical conductivity as a whole. For example, the susceptor 10 may include Al.

After undergoing a process of forming a thin film on the substrate 100 while the substrate 100 and the like are arranged on the substrate mounting surface 10a of the susceptor 10, the substrate 100 is separated from the substrate mounting surface 10a of the susceptor 10. As conceptually shown in FIG. 6, which is a schematic cross-section of the support, taken along line VI-VI of FIG. 5, the substrate 100 is separated from the susceptor 10 at the edge of the substrate 100 by rising the pins 22 located at the edge of the susceptor 10 higher than the pins 21 located at the inner side of the susceptor 10. This is because the substrate 100 is not easily separated from the susceptor 10 due to the electrostatic force between the substrate mounting surface 10a and the substrate 100 when the pins 22 located at the edge of the susceptor 10 and the pins 21 located at the inner side are simultaneously raised by the same amount (e.g., in the +z direction). By separating the edge of the substrate 100 from the susceptor 10 as described above, the central portion of the substrate 100 may contact the susceptor 10 while the edge of the substrate 100 is separated from the susceptor 10.

Depending on the manufacturing process of the display apparatus, charges may be temporarily present in the data line DL and the like on the substrate 100. When the data extension line DEL and the data line DL are integrally formed and not spaced apart from each other, a large amount of electric charges may be accumulated in the data extension line DEL and the data line DL. This is because the data line DL extends long across the display area DA of the substrate 100 and thus has a large total area. In the manufacturing process, charges may also accumulate in the first power line PL1 located on a layer different from a layer on which the data extension line DEL is. Accordingly, a substantially constant potential difference may exist between the first power line PL1 and the data extension line DEL and the data line DL, wherein the data extension line DEL and the data line DL are integrally formed with each other.

In such a situation, as shown in FIG. 6, when the central portion of the substrate 100 is in contact with the susceptor 10 while the edges of the substrate 100 are separated from the susceptor 10, the charges accumulated in the data extension line DEL and the data line DL integrally formed with each other may flow out to the susceptor 10 through the central portion of the substrate 100 due to effects such as tunneling. However, charges accumulated in the first power line PL1 located above the data extension line DEL cannot flow out, and thus, the potential difference between the data extension line DEL and the first power line PL1 may increase rapidly and instantaneously. As a result, a short may occur between the data extension line DEL and the first power line PL1, causing a display apparatus failure.

However, in the display apparatus constructed according to the principles and illustrated embodiments of the invention, the data extension line DEL and the data line DL, which include the same material and have substantially the same layer structure, are separated from each other as shown in FIGS. 2 and 3. Accordingly, as shown in FIG. 6, when the central portion of the substrate 100 is in contact with the susceptor 10 while the edges of the substrate 100 are separated from the susceptor 10, charges accumulated in the data line DL may be transferred to the substrate 100 due to effects such as tunneling and the like, but charges accumulated in the data extension line DEL and the first power line PL1 located above the data extension line DEL cannot flow out. Accordingly, the potential difference between the data extension line DEL and the first power line PL1 is maintained substantially constant, and a short circuit between the data extension line DEL and the first power line PL1 may thus be prevented.

The first power line PL1 may be a so-called ELVDD line that applies power to the organic light-emitting diode 200. Accordingly, in the display area DA, the pixel electrode 210 may contact the first power line PL1 through a contact hole formed in the first interlayer insulating layer 105, the second interlayer insulating layer 107, and the planarization layer 109, as shown in FIG. 4.

The upper surface of the pad PD may be exposed to the outside and electrically connected to an integrated circuit (IC) chip (not shown) such as a driving circuit chip. To this end, the pad PD may have a three-layer structure as shown in FIG. 3. A bump of the IC chip is electrically connected to the pad PD through an anisotropic conductive film and the like, and it is thus desirable to increase the distance between the upper surface of the pad PD and the substrate 100, if possible. To this end, in FIG. 3, the pad PD includes the first pad PD1 on the same layer as the data extension line DEL, the second pad PD2 positioned above the first pad PD1 and including the same material as the first power line PL1, and the third pad PD3 above the second pad PD2.

Figure 7:
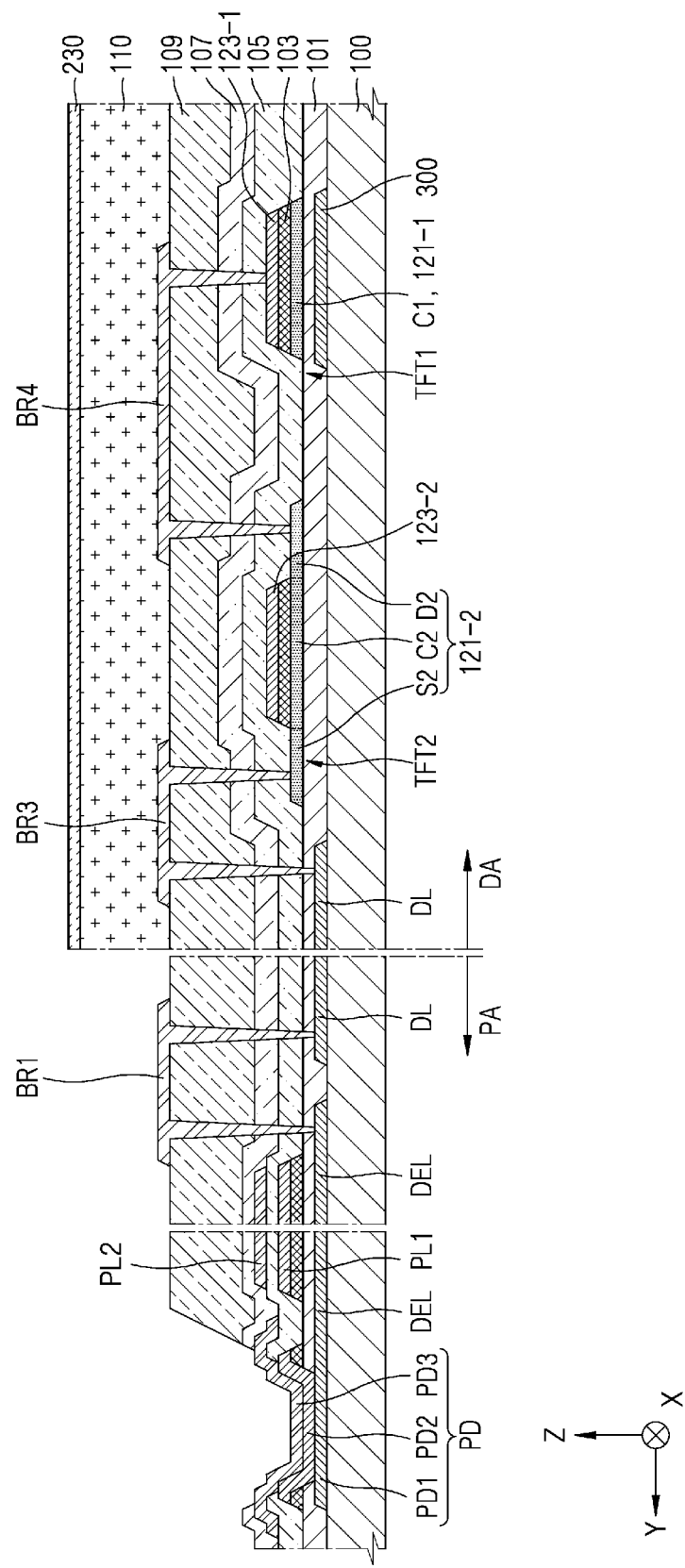
FIG. 7 is a cross-sectional view of a second embodiment of the display apparatus of FIG. 1.

FIG. 7 is a cross-sectional view of a second embodiment of the display apparatus of FIG. 1. For example, FIG. 7 may correspond to the cross-sectional area of FIG. 3. Referring to FIG. 7, the display apparatus may further include a second power line PL2 above the first power line PL1. The pad PD may be spaced apart from these first power line PL1 and second power line PL2 when viewed from a direction perpendicular to the substrate 100. The second power line PL2, for example, may be an ELVSS line, and may contact the common electrode 230 to maintain a potential of the common electrode 230 constant. The second power line PL2 may be between the first interlayer insulating layer 105 and the second interlayer insulating layer 107, may contain a conductive material including Mo, Al, Cu, and Ti, and may have a multi-layer structure or a single layer structure including the above materials. As an example, the second power line PL2 may have a multi-layer structure of Ti/Al/Ti. In this case, the third pad PD3 above the second pad PD2 may contain the same material as the second power line PL2.

Figure 8:
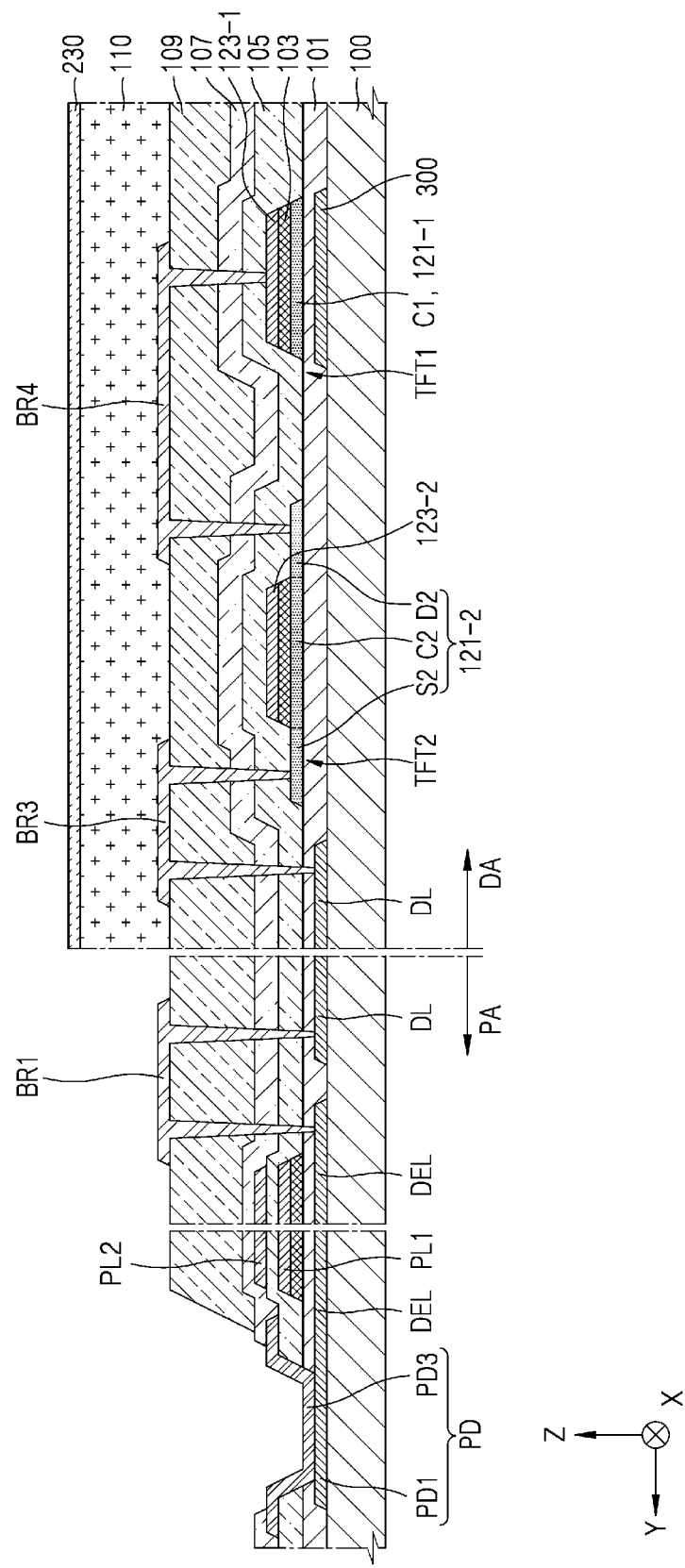
FIG. 8 is a cross-sectional view of a third embodiment of the display apparatus of FIG. 1.

FIG. 8 is a cross-sectional view of a third embodiment of the display apparatus of FIG. 1. For example, FIG. 8 may correspond to the cross-sectional area of FIG. 7. Referring to FIG. 8, the pad PD may have only the first pad PD1 and the third pad PD3 and not have all three of the first to third pads PD1 to PD3. In this case, the first pad PD1 may be integrated with the data extension line DEL, and the third pad PD3 may be above the first pad PD1, and include the same material as the second power line PL2. Of course, the third pad PD3 contacts the first pad PD1 via a contact hole formed in the buffer layer 101 and the first interlayer insulating layer 105. In addition, the pad PD may be spaced apart from the second power line PL2 when viewed from a direction perpendicular to the substrate 100.

Figure 9:
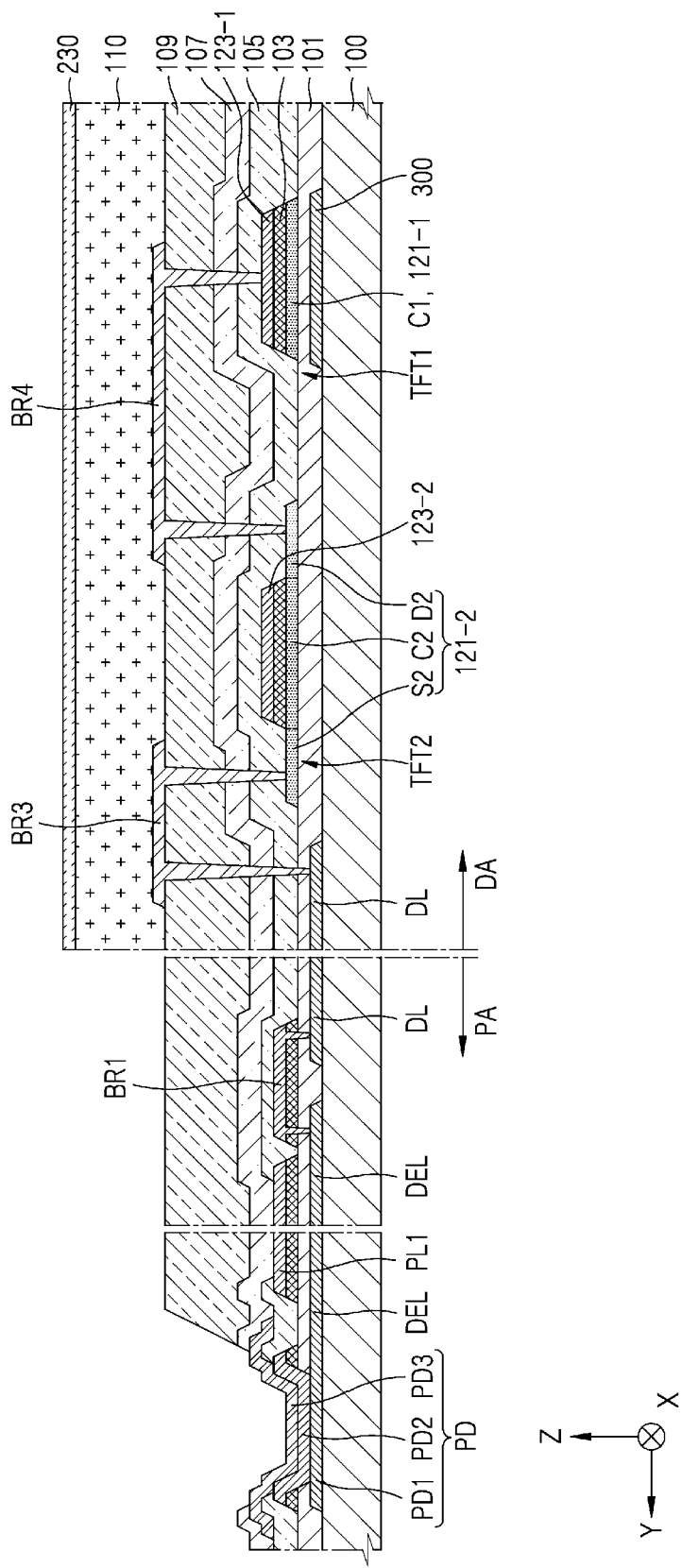
FIG. 9 is a cross-sectional view of a fourth embodiment of the display apparatus of FIG. 1.

So far, the first bridge line BR1 has been described as being on the same layer as the pixel electrode 210, but embodiments are not limited thereto. FIG. 9 is a cross-sectional view of a fourth embodiment of the display apparatus of FIG. 1. For example, FIG. 9 may correspond to the cross-sectional area of FIG. 3. Referring to FIG. 9, the first bridge line BR1 may be on the same layer as the first power line PL1. That is, the first bridge line BR1 may include the same material and have substantially the same layer structure as the first power line PL1. In this case, the first bridge line BR1 electrically connects the data extension line DEL to the data line DL by contacting the other end of the data extension line DEL and one end of the data line DL via contact holes formed in the buffer layer 101. Here, a second power line may be disposed above the first power line PL1 as well.

Figure 10:
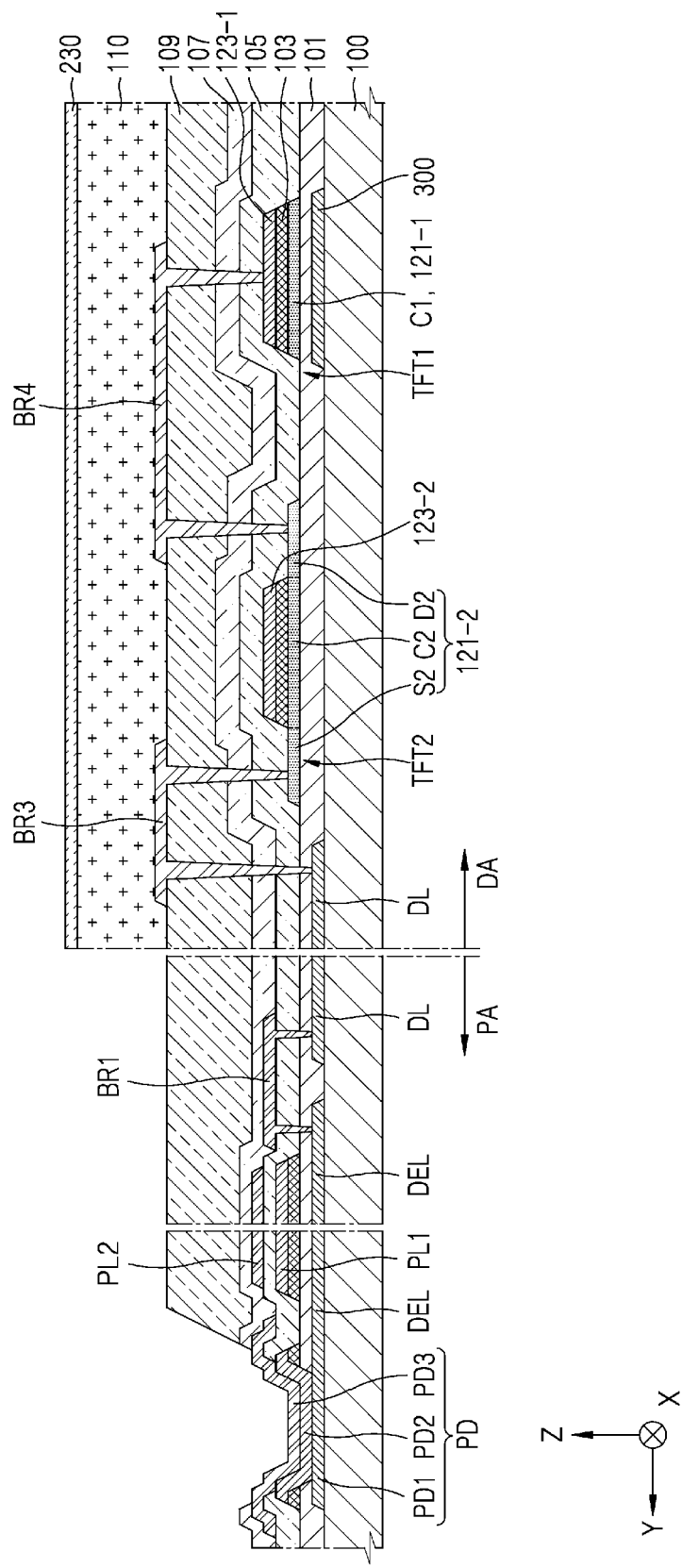
FIG. 10 is a cross-sectional view of a fifth embodiment of the display apparatus of FIG. 1.

FIG. 10 is a cross-sectional view of a fifth embodiment of the display apparatus of FIG. 1. For example, FIG. 10 may correspond to the cross-sectional area of FIG. 9. Referring to FIG. 10, the first bridge line BR1 may be on the same layer as the second power line PL2. That is, the first bridge line BR1 may contain the same material and have substantially the same layer structure as the second power line PL2. In this case, the first bridge line BR1 electrically connects the data extension line DEL and the data line DL to each other by contacting the other end of the data extension line DEL and one end of the data line DL via contact holes formed in the buffer layer 101 and the first interlayer insulating layer 105.

Figure 11:
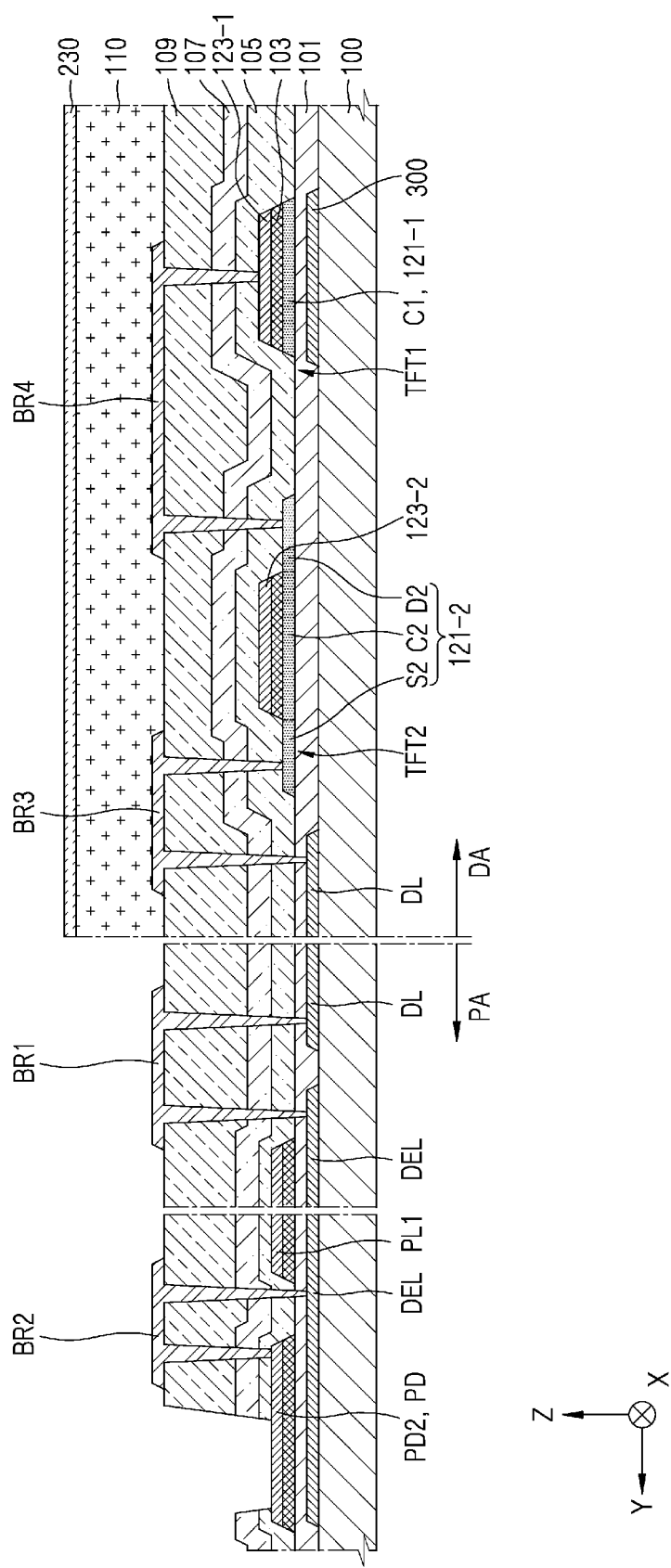
FIG. 11 is a cross-sectional view of a sixth embodiment of the display apparatus of FIG. 1.

FIG. 11 is a cross-sectional view of a sixth embodiment of the display apparatus of FIG. 1. For example, FIG. 11 may correspond to the cross-sectional area of FIG. 3. Referring to FIG. 11, the display apparatus may further include a second bridge line BR2 in addition to the first bridge line BR1. In addition, the data extension line DEL is spaced apart from the pad PD, and the second bridge line BR2 electrically connects the pad PD and the data extension line DEL to each other. In this case, as shown in FIG. 11, the pad PD includes the second pad PD2 located on the same layer as the first power line PL1, and may further include a third pad disposed above the second pad PD2, if necessary. In the latter case, a second power line containing the same material and having substantially the same layer structure as the third pad may be above the first power line PL1. This configuration is also the same in the following embodiments and variations thereof.

The second bridge line BR2 may be on the same layer as the first bridge line BR1. That is, the second bridge line BR2 may include the same material and have substantially the same layer structure as the first bridge line BR1. However, the first bridge line BR1 and the second bridge line BR2 may be located on the same layer as the pixel electrode 210, as shown in FIG. 11. As a modified example, when the display apparatus includes the second power line PL2 (see FIG. 10) above the first power line PL1, at least one of the first bridge line BR1 and the second bridge line BR2 may be positioned on the same layer as the second power line PL2.

The second bridge line BR2 may contact the pad PD via a contact hole formed in the first interlayer insulating layer 105, the second interlayer insulating layer 107, and the planarization layer 109, and the second bridge line BR2 may contact the data extension line DEL via a contact hole formed in the buffer layer 101, the first interlayer insulating layer 105, the second interlayer insulating layer 107, and the planarization layer 109.

The data extension line DEL may extend below the pad PD as shown in FIG. 11 and thereby the upper surface of the pad PD may be sufficiently distant from the substrate 100.

Figure 12:
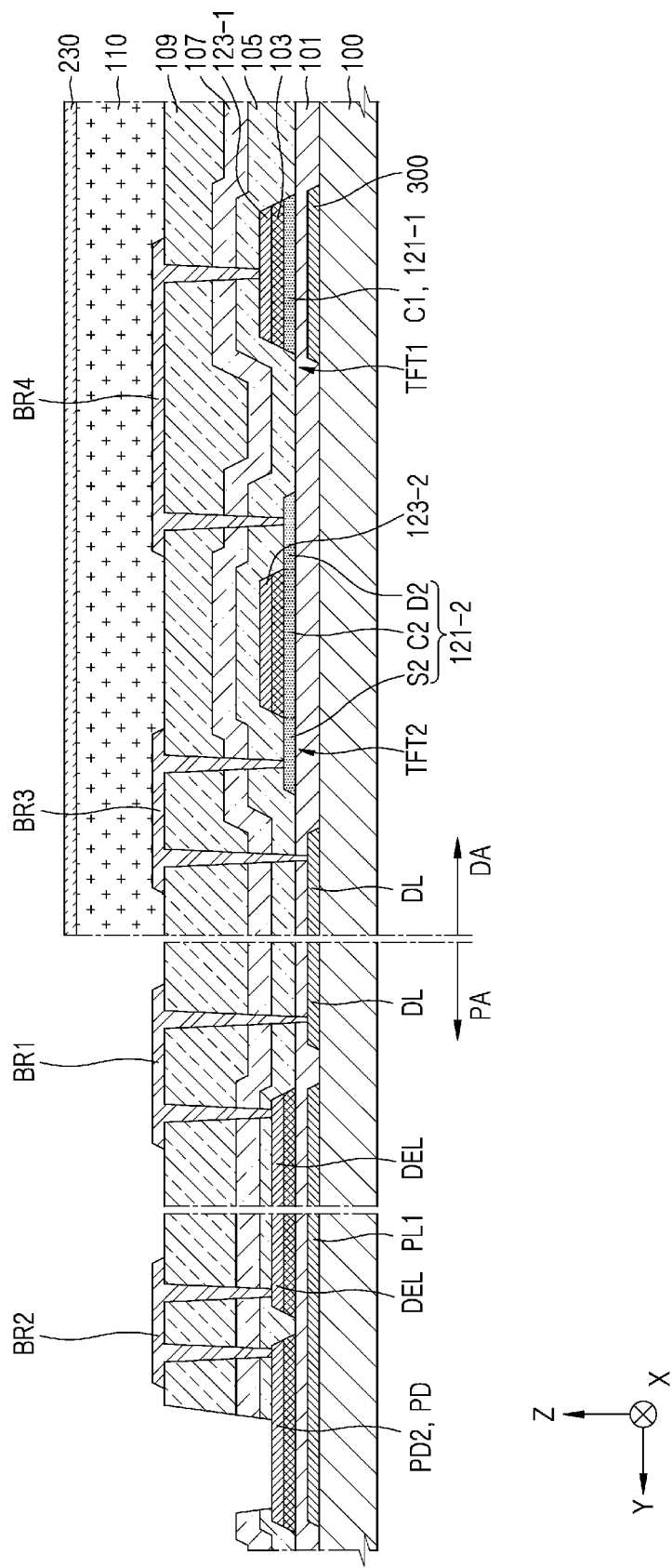
FIG. 12 is a cross-sectional view of a seventh embodiment of the display apparatus of FIG. 1.

So far, the data extension line DEL has been described as being on the same layer as the data line DL and the BML 300. However, embodiments are not limited thereto. FIG. 12 is a cross-sectional view of a seventh embodiment of the display apparatus of FIG. 1. For example, FIG. 12 may correspond to the cross-sectional area of FIG. 11. Referring to FIG. 12, the first power line PL1 may be on the same layer as the data line DL and the BML 300. That is, the first power line PL1 may contain the same material and have substantially the same layer structure as the data line DL and the BML 300. In this case, the data extension line DEL may be above the first power line PL1.

In FIG. 12, the pad PD including the second pad PD2 is spaced apart from the data extension line DEL, and the second bridge line BR2 contacts each of the pad PD and the data extension line DEL to electrically connect them. On the other hand, the second pad PD2 and the data extension line DEL may be integrated in a single member. This is because the second pad PD2 and the data extension line DEL are located on the same layer. This structure also can be applied the same in the following embodiments and variations thereof. In this case, the second pad PD2 and the data extension line DEL may contain the same material and have substantially the same layer structure as the first gate electrode 123-1 and the second gate electrode 123-2.

The data extension line DEL located on the same layer as the first gate electrode 123-1 and the second gate electrode 123-2 may be electrically connected to the data line DL on the same layer as the BML 300 via the first bridge line BR1.

The first power line PL1 may extend below the pad PD as shown in FIG. 12 and thereby the upper surface of the pad PD may be sufficiently distant from the substrate 100. This structure also can be applied the same in the following embodiments and variations thereof.

Figure 13:
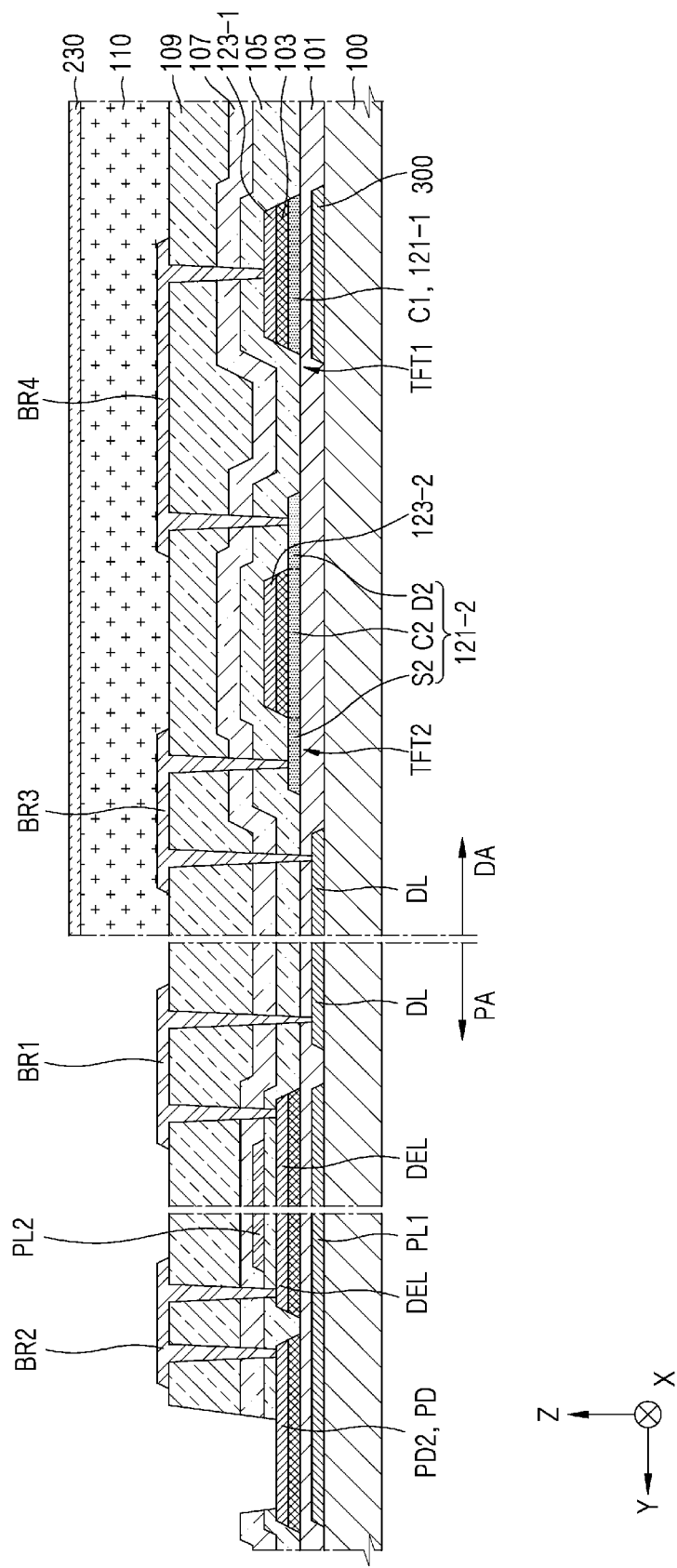
FIG. 13 is a cross-sectional view of an eighth embodiment of the display apparatus of FIG. 1.
Figure 14:
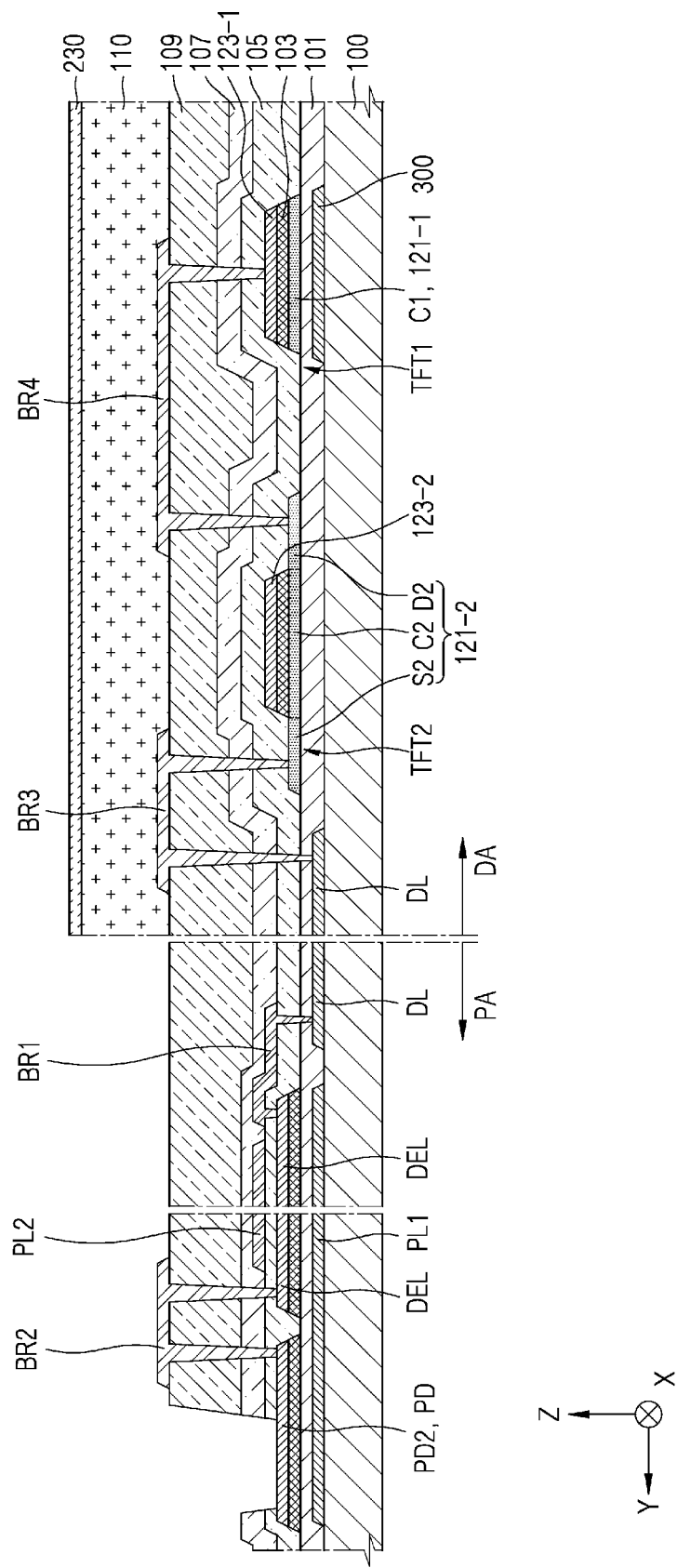
FIG. 14 is a cross-sectional view of a ninth embodiment of the display apparatus of FIG. 1.

FIG. 13 is a cross-sectional view of an eighth embodiment of the display apparatus of FIG. 1, and FIG. 14 is a cross-sectional view of a ninth embodiment of the display apparatus of FIG. 1. For example, FIGS. 13 and 14 may correspond to the cross-sectional area of FIG. 12. Referring to FIG. 13, the display apparatus may further include the second power line PL2 between the first interlayer insulating layer 105 and the second interlayer insulating layer 107 so that the second power line PL2 is above the data extension line DEL. In this case, the first bridge line BR1 may be on the planarization layer 109 like the pixel electrode 210 as shown in FIG. 13. Alternately, referring to FIG. 14, the first bridge line BR1 may be between the first interlayer insulating layer 105 and the second interlayer insulating layer 107. In this case, the first bridge line BR1 may contain the same material and have substantially the same layer structure as the second power line PL2.

For reference, in the display apparatus having a structure as shown in FIGS. 13 and 14, the pad PD may further include the third pad located above the second pad PD2, electrically connected to the second pad PD2, and containing the same material and having substantially the same layer structure as the second power line PL2, in addition to the second pad PD2.

Figure 15:
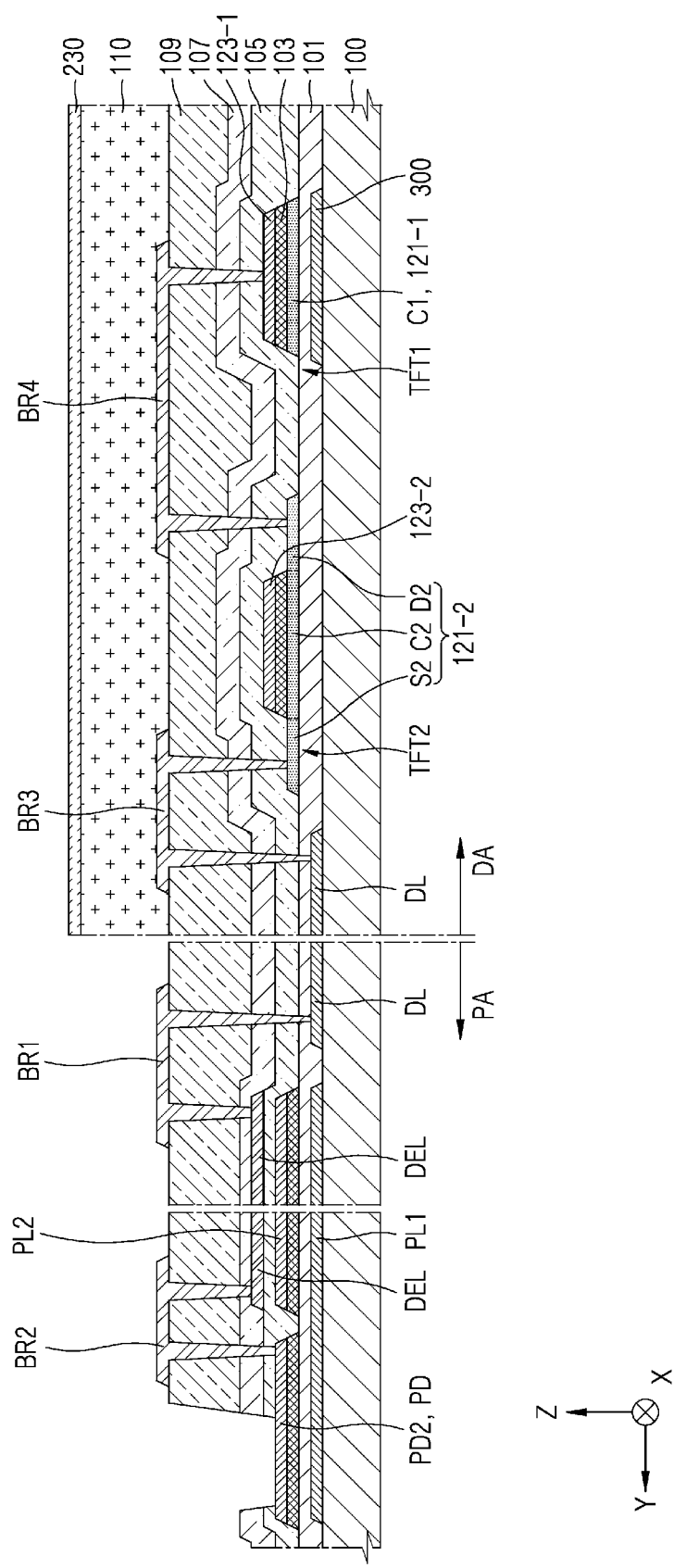
FIG. 15 is a cross-sectional view of a tenth embodiment of the display apparatus of FIG. 1.

FIG. 15 is a cross-sectional view of a tenth embodiment of the display apparatus of FIG. 1. For example, FIG. 15 may correspond to the cross-sectional area of FIG. 12. Referring to FIG. 15, the first power line PL1 is on the same layer as the data line DL and the BML 300 as described above. That is, the first power line PL1 may contain the same material and have substantially the same layer structure as the data line DL and the BML 300.

The data extension line DEL may be above the first power line PL1. For example, the data extension line DEL is between the first interlayer insulating layer 105 and the second interlayer insulating layer 107. The second power line PL2 is between the first power line PL1 and the data extension line DEL. The second power line PL2 is on the same layer, includes the same material, and has substantially the same layer structure as the first gate electrode 123-1 and the second gate electrode 123-2.

The data extension line DEL between the first interlayer insulating layer 105 and the second interlayer insulating layer 107 may be electrically connected to the data line on the same layer as the BML 300 through the first bridge line BR1.

The first power line PL1 may extend below the pad PD as shown in FIG. 15 and thereby the upper surface of the pad PD may be sufficiently distant from the substrate 100.

In the drawings to which reference is made in describing the various embodiments and the modifications so far, the gate insulating layer 103 is shown as being patterned the same way as the first gate electrode 123-1 or the second gate electrode 123-2 is. However, embodiments are not limited thereto, and the gate insulating layer 103 may overlap substantially the entire surface of the substrate 100. In this case, the first to fourth bridge lines BR1 to BR4 may pass through contact holes that are also formed in the gate insulating layer 103, in some cases.

So far, an organic light-emitting display apparatus has been mainly described, but embodiments are not limited thereto. That is, embodiments may applied to any display apparatus having the pixel electrode 210 as shown in the drawings, such as, for one example, a quantum dot display apparatus configured to emit light of a single wavelength, such as blue light, and convert the blue light into red light or green light by using quantum dots thereon.

According to the principles and embodiments of the invention, a display apparatus can be made in which the probability of a defect occurring during the manufacturing process is reduced. However, the embodiments are not limited by these effects.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display apparatus comprising:
a substrate including a display area and a peripheral area outside the display area;
a pad located in the peripheral area;
a first line located in the peripheral area and having one end electrically connected to the pad and the other end facing the display area;
a second line having one end facing the other end of the first line and extending into the display area, the one end of the second line being spaced apart from the first line;
a first connector line electrically connecting the other end of the first line to the one end of the second line;
a first power line intersecting the first line, the first power line being disposed above the first line; and
a second power line disposed above the first power line.

2. The display apparatus of claim 1, wherein the first line and the second line include the same material and have substantially the same layer structure.

3. The display apparatus of claim 1, wherein the first line and the second line are disposed on the same layer.

4. The display apparatus of claim 1, wherein the first connector line and the first power line include the same material and have substantially the same layer structure.

5. The display apparatus of claim 4, wherein the first connector line and the first power line are disposed on the same layer.

6. The display apparatus of claim 1, wherein the pad comprises:
a first pad disposed on the same layer as the first line;
a second pad disposed above the first pad and including the same material as the first power line; and
a third pad disposed above the second pad and including the same material as the second power line.

7. The display apparatus of claim 6, wherein, the pad is spaced apart from the first power line and the second power line.

8. The display apparatus of claim 1, wherein the pad comprises:
a first pad integrally formed with the first line; and
a third pad disposed above the first pad and including the same material as the second power line.

9. The display apparatus of claim 8, wherein, the pad is spaced apart from the second power line.

10. The display apparatus of claim 1, wherein the first connector line and the first power line include the same material and have substantially the same layer structure.

11. The display apparatus of claim 10, wherein the first connector line and the first power line are disposed on the same layer.

12. The display apparatus of claim 1, wherein the first connector line and the second power line include the same material and have substantially the same layer structure.

13. The display apparatus of claim 12, wherein the first connector line and the second power line are disposed on the same layer.

14. The display apparatus of claim 1, wherein the second power line is disposed between
wherein the second line is disposed on the same layer as the first power line.

15. The display apparatus of claim 1, further comprising a pixel electrode in the display area, and
wherein the first connector line and the pixel electrode include the same material and have substantially the same layer structure.

16. The display apparatus of claim 1, further comprising a pixel electrode in the display area, and
wherein the first connector line and the pixel electrode are disposed on the same layer.

17. The display apparatus of claim 1, wherein the first line comprises a data extension line, the second line comprises a data line, the first connector line comprises a first bridge line, and further comprising: a second connector line comprising a second bridge line.

18. A display apparatus comprising:
a substrate including a display area and a peripheral area outside the display area;
a pad located in the peripheral area;

a first line located in the peripheral area and having one end electrically connected to the pad and the other end facing the display area;

a second line having one end facing the other end of the first line and extending into the display area, the one end being spaced apart from the first line;

a first connector line electrically connecting the other end of the first line to the one end of the second line;

a first power line intersecting the first line, the first power line being disposed on a first layer different from a second layer on which the first line is disposed; and a second connector line electrically connecting one end of the first line to the pad, the one end of the first line being spaced apart from the pad, wherein the second connector line is disposed on the same layer as the first connector line.

19. The display apparatus of claim 18, wherein the second connector line includes the same material as the first connector line and has substantially the same layer structure as the first connector line.

20. A display apparatus comprising:

a substrate including a display area and a peripheral area outside the display area;

a pad located in the peripheral area;

a first line located in the peripheral area and having one end electrically connected to the pad and the other end facing the display area;

a second line having one end facing the other end of the first line and extending into the display area, the one end being spaced apart from the first line;

a first connector line electrically connecting the other end of the first line to the one end of the second line;

a first power line intersecting the first line, the first power line being disposed on a first layer different from a second layer on which the first line is disposed; and second power line disposed above the first line, wherein the second line is disposed on the same layer as the first power line, and the first line is disposed above the first power line.

21. The display apparatus of claim 20, wherein the first connector line and the second power line include the same material and have substantially the same layer structure.

22. The display apparatus of claim 20, wherein the first connector line and the second power line are disposed on the same layer.

23. The display apparatus of claim 20, wherein the pad comprises:

a first pad integrally formed with the first line; and a third pad disposed above the first pad and including the same material as the second power line.

24. A display apparatus comprising:

a substrate including a display area and a peripheral area outside the display area;

a pad located in the peripheral area;

a first line located in the peripheral area and having one end electrically connected to the pad and the other end facing the display area;

a second line having one end facing the other end of the first line and extending into the display area, the one end being spaced apart from the first line;

a first connector line electrically connecting the other end of the first line to the one end of the second line; and a first power line intersecting the first line, the first power line being disposed on a first layer different from a second layer on which the first line is disposed, wherein the first line comprises a data extension line, the second line comprises a data line, and the first connector line comprises a first bridge line.

* * * * *